(12) United States Patent
Moheban et al.

(10) Patent No.: US 10,621,122 B1
(45) Date of Patent: Apr. 14, 2020

(54) SYSTEMS AND METHODS FOR TRANSFERRING DATA WITH A DUAL-LINE FIRST-IN-FIRST-OUT (FIFO) MEMORY ARRAY

(71) Applicant: Marvell Israel (M.I.S.L.) Ltd., Yokneam (IL)

(72) Inventors: Lior Moheban, Nes Zionna (IL); Ronen Goldberg, Givat Shmuel (IL); Yakov Tokar, Rishon Lezion (IL); Gregory Kovishaner, Ramat-Gan (IL); Alex Pinskiy, Ashkelon (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 18 days.

(21) Appl. No.: 15/978,736

(22) Filed: May 14, 2018

Related U.S. Application Data

(60) Provisional application No. 62/505,469, filed on May 12, 2017, provisional application No. 62/650,197, filed on Mar. 29, 2018.

(51) Int. Cl.
*G06F 13/38* (2006.01)
*G06F 3/06* (2006.01)
*G06F 5/06* (2006.01)
*G06F 13/16* (2006.01)
*G06F 13/40* (2006.01)
*H03K 3/356* (2006.01)

(52) U.S. Cl.
CPC ...... *G06F 13/1689* (2013.01); *G06F 13/4068* (2013.01); *H03K 3/356017* (2013.01)

(58) Field of Classification Search
CPC .............. G06F 3/06; G06F 5/06; G06F 13/38
See application file for complete search history.

(56) References Cited

U.S. PATENT DOCUMENTS

| 4,592,019 A * | 5/1986 | Huang | ...................... G06F 7/78 365/189.05 |
| 7,573,770 B1 * | 8/2009 | Zhang | ...................... G06F 5/06 365/189.02 |

* cited by examiner

*Primary Examiner* — David E Martinez

(57) ABSTRACT

Embodiments described herein provide a dual-line FIFO structure without the use of any multiplexer. Instead, the dual-line FIFO described herein uses a selectively transparent latch and a flip-flop serially connected to the latch, such that the combination of the serially connected latch and the flip-flop can temporarily store up to two data units at two clock cycles.

20 Claims, 9 Drawing Sheets

US 10,621,122 B1

SYSTEMS AND METHODS FOR TRANSFERRING DATA WITH A DUAL-LINE FIRST-IN-FIRST-OUT (FIFO) MEMORY ARRAY

CROSS-REFERENCE TO RELATED APPLICATIONS

This disclosure claims the benefit under 35 U.S.C. § 119(e) of U.S. Provisional Patent Application Nos. 62/505,469, filed on May 12, 2017 and 62/650,197 filed on Mar. 29, 2018, which are all hereby incorporated by reference herein in their entirety.

This application is related to U.S. Nonprovisional patent application Ser. No. 15/866,690, filed on Jan. 10, 2018, which is hereby incorporated by reference herein in its entirety.

FIELD OF USE

This disclosure relates to dual-line first-in first-out (FIFO) elements in switching designs, and specifically synchronizing data with a dual-line first-in-first-out (FIFO) memory array.

BACKGROUND OF THE INVENTION

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

Dual-line first-in-first-out (FIFO) memory elements are commonly used for data synchronizing purposes in large electronic devices, e.g., in switching devices. For example, when data is transferred via a wired coupling for a long distance in large scale switching dies, the data transfer is usually done using dual-line FIFOs that are interspersed along the coupling. For another example, data buffers insides an Internet Protocol (IP) based device usually include a number of FIFOs. The data width of FIFOs can range from a few bits to thousands of bits. Thus, there are usually a large number of dual-line FIFOs spread out all over a system-on-a-chip (SOC) circuit. These FIFOs typically consume a significant amount of circuit area, power and routing resources. Specifically, a conventional dual-line FIFO includes two flip-flops to write the dual-line data bits, and a multiplexer to output data from the two flip-flops. As each multiplexer consumes a significant circuit area, when there are a large number of FIFOs on the SOC, the collection of FIFOs necessitates the use of considerable circuit resources.

SUMMARY

Embodiments described herein provide an electronic device in which synchronized data signals are transmitted between a signal originator and a signal receiver. The electronic device includes a data transmitter disposed on the electronic device. The data transmitter is configured to transmit data units to a receiver on the electronic device over a wired coupling. The electronic device includes one or more data synchronizers disposed along the wired coupling. The one or more synchronizers are operative to synchronize, to a device clock signal, transfer of the data units over the wired coupling. The one or more data synchronizers include a first data synchronizer configured as a first first-in-first-out (FIFO) memory element for temporarily storing up to two data units according to an order received. The first FIFO memory element includes a flip-flop governed by a gated clock signal. The flip-flop is configured to temporarily store a data unit that is transferred along the wired coupling and to release the stored data unit according to a triggering edge of the gated clock signal. The first FIFO element further includes a selectively transparent latch serially coupled to the first flip-flop and governed by a latch enable signal that is indicative of a fill status of the first flip-flop. The selectively transparent latch is configured to transparently pass data units to a next memory storage element when a voltage level of the latch enable signal is high, or to stall passage of the data units when the voltage level of the latch enable signal is low.

In some implementations, the selectively transparent latch is serially connected to an input of the first flip-flop, and the first flip-flop is configured to receive data units passed through from the first selectively transparent latch. The first FIFO memory element further includes control circuitry configured to determine the fill status of the first flip-flop, and generate an input ready signal having a high voltage level when the determined fill status of the first flip-flop indicates the first flip-flop is ready to receive new data, or a low voltage level when the determined fill status of the first flip-flop indicates the first flip-flop is not ready to receive new data.

In some implementations, the first FIFO memory element further includes an AND logic element configured to perform an AND logic operation on the device clock signal and the input ready signal indicating availability of the first flip-flop to receive new data to generate the latch enable signal that is synchronized to the device clock signal for the first selectively transparent latch.

In some implementations, the first FIFO memory element further includes a gated clock circuit, configured to generate the gated clock signal. The gated clock circuit includes a second latch governed by the device clock signal. The second latch is configured to pass through, or stall passage of a first output ready signal depending on a voltage level of the device clock signal. The output ready signal is received from a second FIFO memory element serially connected to the first FIFO memory element. The AND logic element is configured to perform an AND logic operation on the device clock signal and an output signal from the second latch to generate the gated clock signal that triggers the first flip-flop to release a stored data unit.

In some implementations, the first FIFO memory element is configured to receive a first write command to temporarily store a first data unit at a first clock cycle and a second write command to temporarily store a second data unit at a second clock cycle. During the first clock cycle, the selectively transparent latch is configured to receive and pass through the first data unit to the flip-flop, and the flip-flop is configured to receive and temporarily store the first data unit. During the second clock cycle subsequent to the first clock cycle, the selectively transparent latch is configured to receive the second data unit and stall passage of the second data unit to the flip-flop, and the flip-flop is configured to continue storing the first data unit.

In some implementations, the first FIFO memory element is configured to receive a read command at a third clock cycle. During the third clock cycle, the flip-flop is configured to output the first data unit to the next memory element at a triggering edge of the third clock cycle, and to sample an output data unit from the first selectively transparent latch and temporarily store the sampled output data unit.

In some implementations, the selectively transparent latch is serially connected to an output of the first flip-flop, and the selectively transparent latch is configured to receive data units released from the first flip-flop. The first FIFO memory element further includes control circuitry configured to determine the fill status of the first flip-flop, determine a number of data units that are temporarily stored at the first FIFO memory element based at least in part on the fill status of the first flip-flop, and generate a high voltage level for the latch enable signal for the selectively transparent latch to pass data units when the number of data units equals two.

In some implementations, the first FIFO element further includes a first gated clock circuit configured to generate the first gated clock signal. The first gated clock element includes a second latch governed by the device clock signal. The second latch is configured to pass through a first input ready signal when a voltage of the device clock signal is high, or stall passage of the first input ready signal when the voltage level of the device clock signal is low. The first gated clock element further includes an AND logic element configured to perform an AND logic operation on the device clock signal and a first output signal from the second latch to generate the first gated clock signal to trigger the first flip-flop to release the stored data unit. The first FIFO element includes a second gated clock element configured to generate the latch enable signal. The second gated clock element includes a third latch governed by the device clock signal. The third latch is configured to pass through a first output ready signal when a voltage level of the device signal is high, or stall passage of the first output ready signal when the voltage level of the device clock signal is low. The second gated clock includes an AND logic element configured to perform an AND logic operation on the device clock signal and an output signal from the third latch to generate the third gated clock signal.

In some implementations, the first FIFO memory element is configured to receive a first write command to temporarily store a first data unit at a first clock cycle and a second write command to temporarily store a second data unit at a second clock cycle. During the first clock cycle, the flip-flop is configured to receive and temporarily store the first data unit before a next triggering edge of the gated clock signal. During the second clock cycle, the flip-flop is configured to release the first data unit at the next triggering edge of the gated clock signal, receive and temporarily store the second data unit, and the second selectively transparent latch is configured to receive and pass the first data unit as an output of the first FIFO memory element.

In some implementations, the one or more data synchronizers comprise a plurality of serially connected FIFO memory elements along the wired coupling including the first FIFO memory element. The first FIFO memory element is configured to transmit, a first input ready signal indicating whether the first flip-flop is ready to receive new data, to a previous memory element that is configured to output data to the first FIFO memory element depending on a voltage level of the first input ready signal. The first FIFO memory element is further configured to receive a first output ready signal from a next memory element that is configured to receive data from the first FIFO memory element depending on a voltage level of the first output ready signal.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for synchronizing data with a dual-line first-in-first-out (FIFO) memory array. Dual-line FIFO memory elements are used in data synchronizers for transferring data via a wired coupling on an electronic device. Conventional dual-line FIFO memory element usually includes a pair of flip-flops disposed in parallel, and the outputs of the pair of flip-flops are multiplexed by a multiplexer, which usually consumes a significant circuit area.

Embodiments described herein provide a dual-line FIFO structure without the use of any multiplexer. Instead, the dual-line FIFO described herein uses a selectively transparent latch and a flip-flop serially connected to the latch, such that the combination of the serially connected latch and the flip-flop can temporarily store up to two data units at two clock cycles (as further described in relation to FIGS. 5 and 7). The dual-line FIFO without a multiplexer consumes less circuit area compared with the conventional dual-line FIFO with a multiplexer. In addition, the dual-line FIFO described herein, which includes a latch (two transistors) and a flip-flop (four transistors), contains a smaller number of transistors than the conventional multiplexer-based FIFO (at least eight transistors for the two flip-flops). As such, because of the reduced number of transistors, the dual-line FIFO in accordance with the present disclosure is also expected to consume less circuit power than a conventional dual-line FIFO that is used to temporarily store up to two data units.

Figure 1:
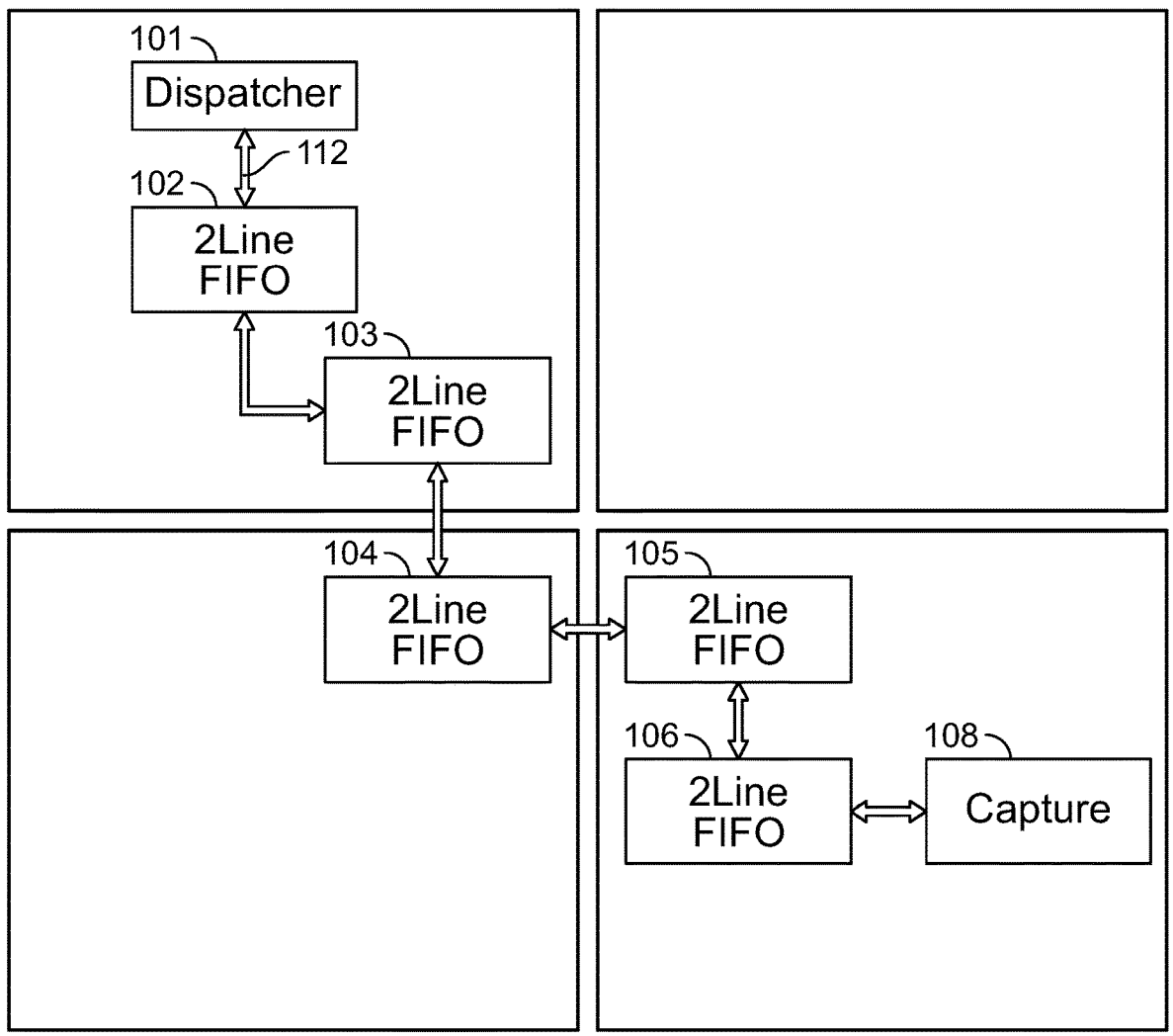
FIG. 1 is a block diagram illustrating an example electronic device that is configured to send data units from a dispatcher to a capturer via a wired coupling on the device, according to embodiments described herein.

FIG. 1 is a block diagram illustrating an example electronic device, such as a network switch, that is configured to send data units from a dispatcher to a capturer via a wired coupling on the device, according to embodiments described herein. The circuit diagram 100 shows a dispatcher 101, e.g., a signal originator or a data transmitter, and a capturer 108, e.g., a signal receiver. The dispatcher 101 is configured to transmit data units 112 to the capturer/receiver 108 on the electronic device over a wired coupling, which is composed of one or more data synchronizers 102-106 that are operative, in an embodiment, to synchronize signals bearing the data units to a system clock (not seen). For example, one or more of the data synchronizers 102-106 are configured as dual-line FIFO memory elements, each of which is configured to temporarily store up to two data units that are transferred along the wired coupling, and the two data units are passed along the wired coupling in an order as they are received at the dispatcher 101.

Figure 2:
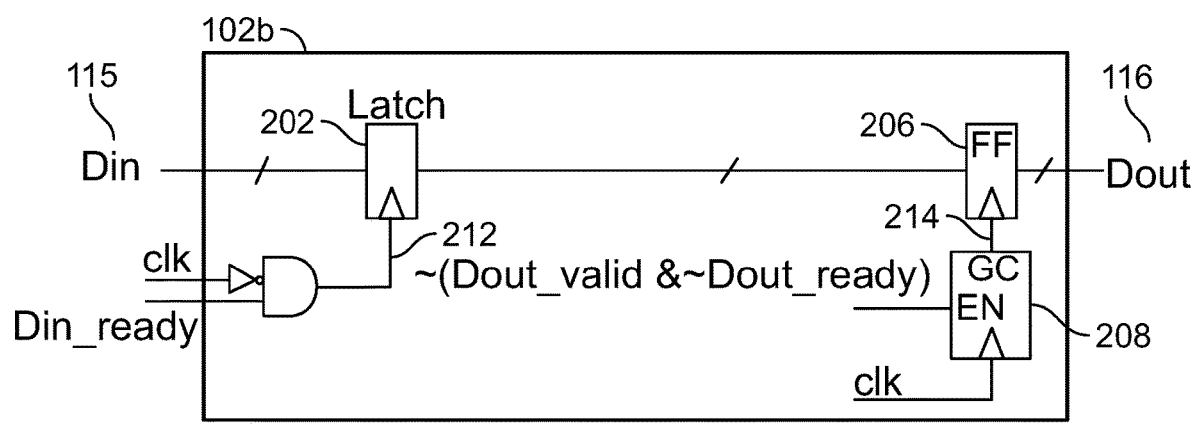
FIG. 2 is a block diagram illustrating an example structure for one of the FIFO memory elements as shown in FIG. 1, according to embodiments described herein.
Figure 7:
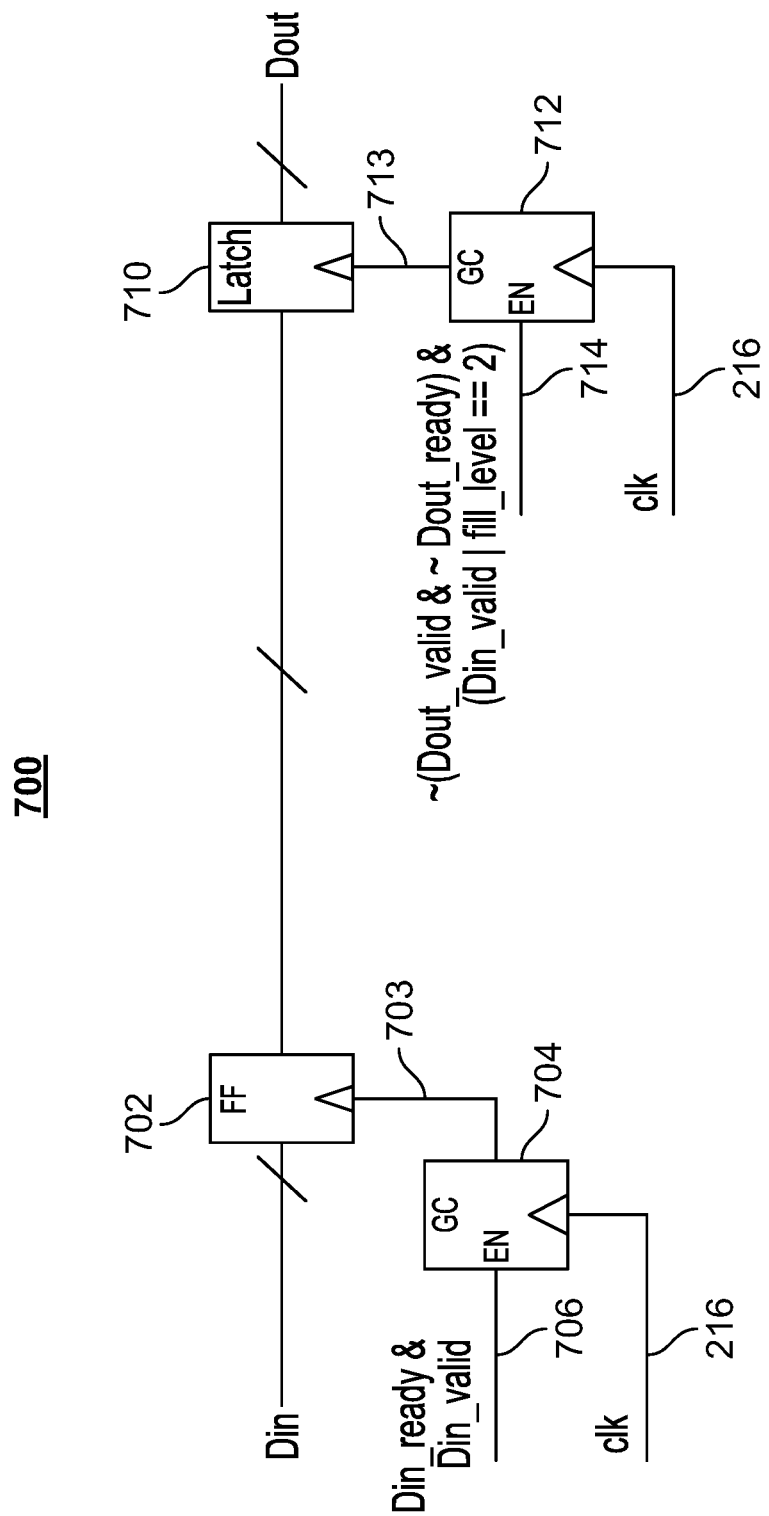
FIG. 7 depicts a circuit diagram showing an alternative circuit structure of one of the FIFO elements shown in FIG. 1, according to embodiments described herein.

FIG. 2 is a block diagram illustrating an example structure of a FIFO memory element (e.g., one of 102-106 shown in FIG. 1), according to embodiments described herein. The FIFO structure 102 shown in FIG. 2 is configured for temporarily storing up to two data units. The stored data units are subsequently released in an order received, to a next memory element (e.g., FIFO element 104 in FIG. 1). The FIFO structure 102 includes a selectively transparent latch 202 governed by a latch enable signal 212, and a flip-flop 206 that is separate from and is serially connected to the selectively transparent latch 202. In one embodiment, the selectively transparent latch 202 is placed before the flip-flop 206, as shown in FIG. 2. In an alternative embodiment, the flip-flop is placed before the selectively transparent latch, as shown in FIG. 7. In the embodiment of FIG. 2, the selectively transparent latch 202 is configured to receive a data unit from the input data stream 115 that is transferred along the wired coupling, and transparently pass the data unit to the flip-flop 206, or to stall passage of the data units, based at least on a voltage level of the latch enable signal 212. The latch enable signal 212 is derived from and is indicative of a fill status of the flip-flip 206, as further described in FIG. 5. The flip-flop 206 is governed by a gated clock signal 214 generated by a gated clock circuit 208 to synchronize with the device clock signal 216. In the embodiment of FIG. 2, the flip-flop 206 is configured to temporarily store a data unit received from the selectively transparent latch 202 and to release the stored data unit according to a triggering edge of the gated clock signal 214, thereby synchronizing transmission of the data unit to the clock signal. When the flip-flop 206 is already occupied by a data unit, and a new data unit is received at the selectively transparent latch 202, the selectively transparent latch 202 is configured to stall passage of the new data unit until the next triggering edge of the gated clock signal 214, which prompts the flip-flop 206 to vacate its storage cell by releasing the stored data unit. The combination of the serially connected latch 202 and flip-flop 206 temporarily "holds" up to two data units, in an embodiment. Further structural and functional detail of the FIFO structure 102 is described in relation to FIG. 5.

Figure 3:
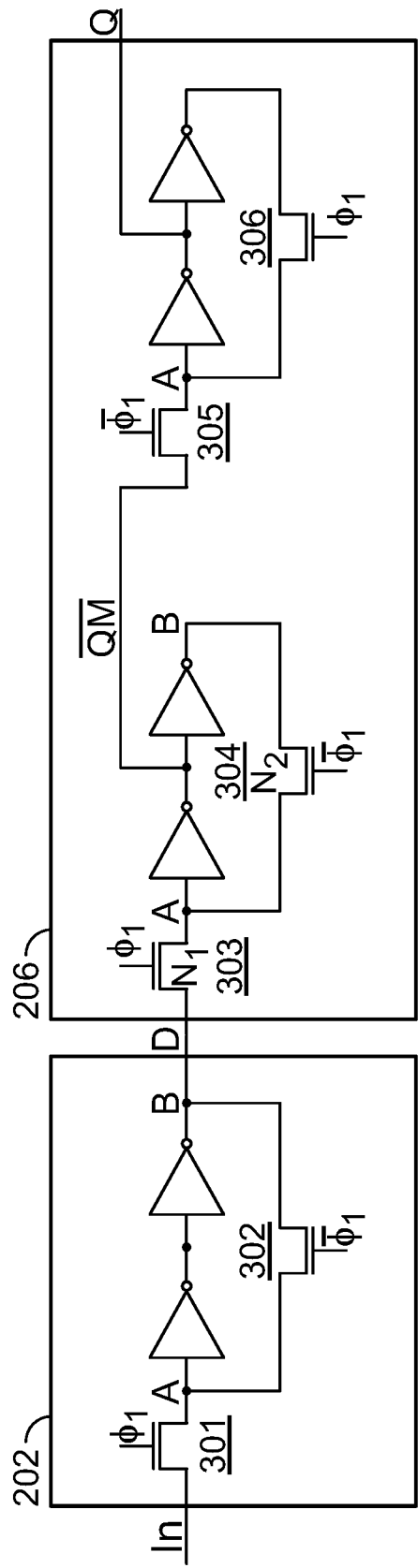
FIG. 3 provides an example circuit diagram illustrating the transistor level structure of the FIFO element described in FIG. 2, according to an embodiment described herein.

As described above, the FIFO structure 102 temporarily stores up to two data units, which yields comparable FIFO performance as a conventional FIFO that multiplexes two parallel outputs from two flip-flops placed in parallel. However, the FIFO structure 102, without any multiplexer, consumes much less circuit area, and also requires fewer transistors to save circuit power. For example, FIG. 3 is an example circuit diagram illustrating the transistor level structure of the FIFO element 102 in FIG. 2. In the embodiment seen in FIG. 3, the selectively transparent latch 202 requires two transistors 301 and 302, and the flip-flop 206 requires four transistors 303-306. The FIFO element 102 requires a fewer number of transistors (e.g., six) compared with a conventional FIFO element that includes at least a pair of flip-flops (e.g., at least eight transistors because each flip-flop requires four transistors), and thus requires less circuit power to drive the transistors.

Figure 4:
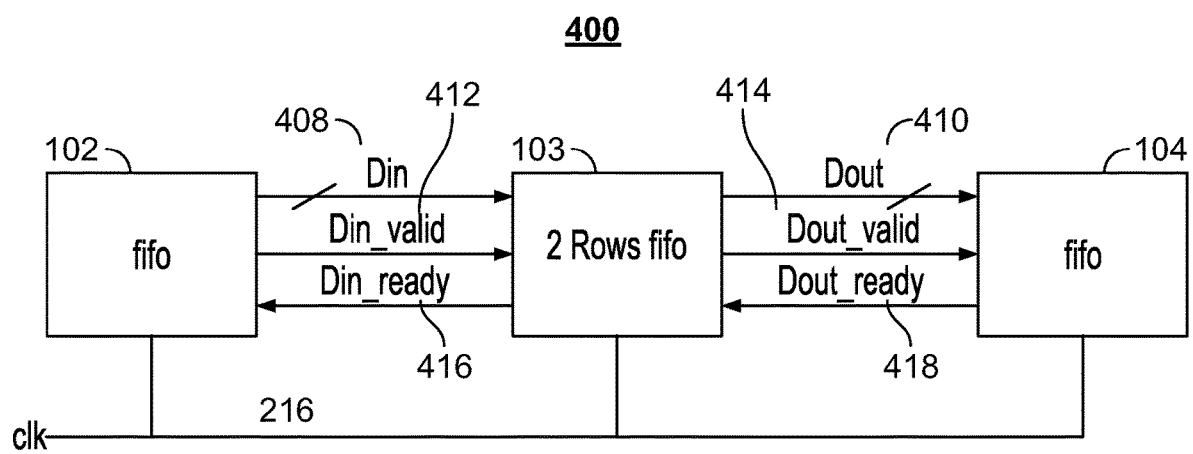
FIG. 4 provides an example diagram illustrating signaling between serially connected FIFO elements along the wired coupling shown in FIG. 1, according to embodiments described herein.

FIG. 4 is an example schematic diagram 400 illustrating signaling between serially connected FIFO elements along the wired coupling shown in FIG. 1, according to embodiments described herein. For example, each of the FIFO elements 102, 103 and 104 may correspond to any of the FIFO elements 102-106 along the wired coupling to transfer and synchronize data transfer between the dispatcher 101 and the capturer/receiver 108 in FIG. 1. Each of the FIFO elements 102-104 is based, in an embodiment, on a latch-based structure as shown at 102 in FIG. 2 or alternatively a latch-based structure 700 further described in relation to FIG. 7. The FIFO elements 102-104 are synchronized to a device clock signal 216.

Control signals are passed between the serially connected FIFO elements 102-104, e.g., to indicate whether a respective FIFO element is ready to receive new data. For example, the FIFO element 103 is configured to receive data units 408 from the previous FIFO element 102 and to output data units 410 to the next FIFO element 104. The data units 410 are in the same order as the data units 408 but delayed in time.

In some embodiments, the FIFO element 103 is configured to receive an input-valid signal 412 (referred to as Din_valid) from the previous FIFO element 102, indicating that the input data unit 408 from the previous FIFO element 102 is valid. Similarly, the FIFO element 103 is configured to send an output-valid signal 414 (referred to as Dout_valid) to the next FIFO element 104, indicating that the data units 410 output from the FIFO element 103 are valid.

In some embodiments, the FIFO element 103 is configured to generate and send an input ready signal 416 (referred to as Din_ready) to the previous FIFO element 102, noting that the FIFO element 103 is ready to receive new data, e.g., when the flip-flop (e.g., see 206 in FIG. 2) inside the FIFO element 103 has released the temporarily stored data unit and is ready to receive new data. Similarly, the FIFO element 103 is configured to receive an output ready signal 418 (referred to as Dout_ready) from the next FIFO element 104, generated by control circuitry within the next FIFO element 104 to indicate whether the next FIFO element 104 is ready to receive new data such that the FIFO element 103 is able to output new data. Specifically, the Dout_ready signal 418 generated by FIFO element 104 is equivalent to an input ready signal for the FIFO element 104, which indicates whether FIFO element 104 is ready to receive new data. Similarly, the Din_ready signal 416 sent to FIFO element 102 is equivalent to an output ready signal for the FIFO element 102, which indicates whether FIFO element 102 is able to output new data the next memory element 103.

In some embodiments, each of the FIFO elements 102-104 includes logic control circuitry configured to determine a status of the components (latch or flip-flop) inside each respective FIFO element and generate an input ready signal. For example, control circuitry within the FIFO element 103 is configured to examine a status of the flip-flop inside 103 to determine whether the flip-flop is occupied or empty, and then generate an input-ready signal having a voltage level to indicate whether the FIFO element is ready to receive new data, e.g., a high voltage level indicating ready to receive and a low voltage level indicating not ready to receive.

Figure 5:
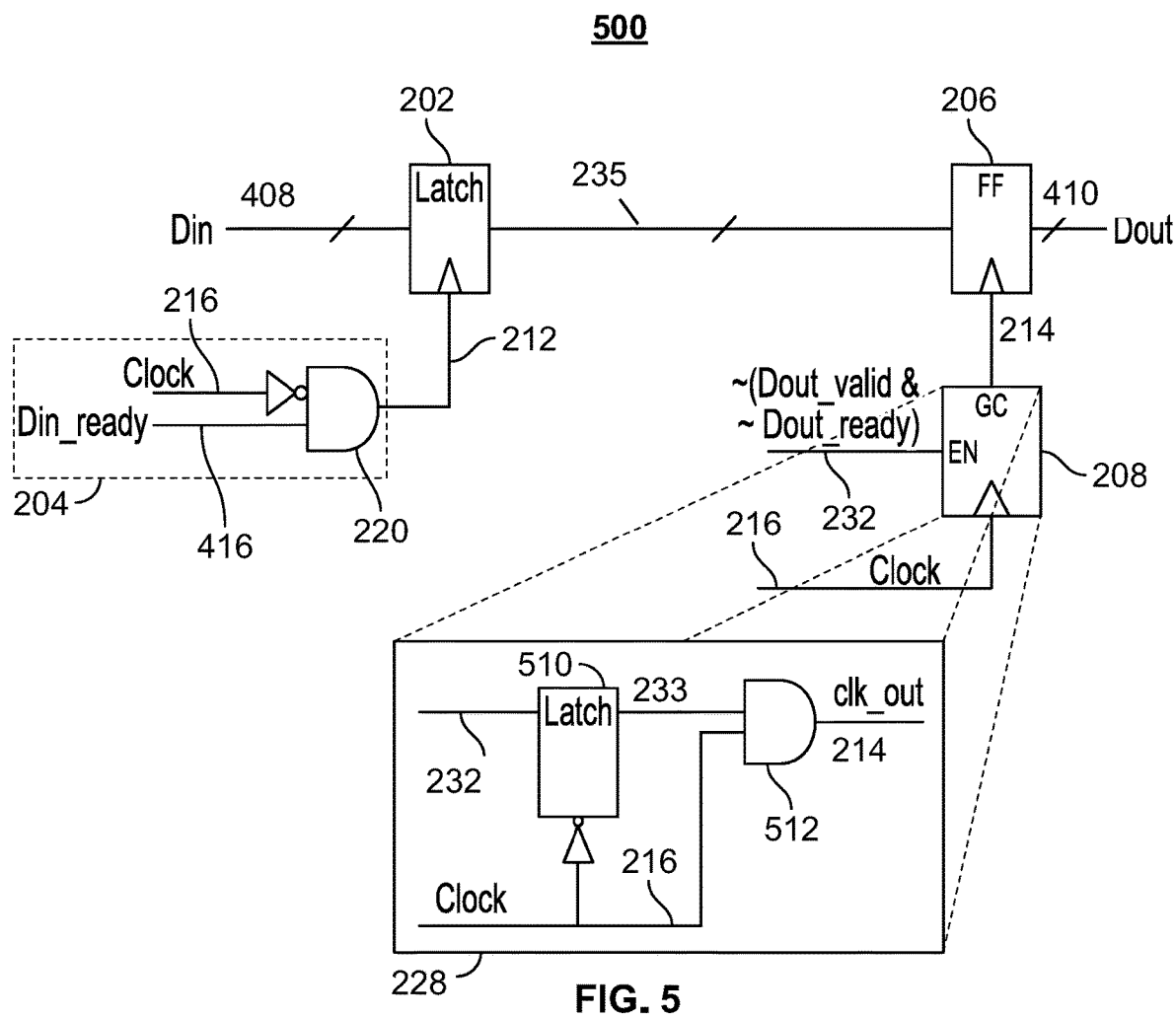
FIG. 5 depicts a circuit diagram showing the circuit structure of a FIFO element as shown in FIG. 2 as an embodiment of one of FIFO elements shown in FIG. 1, according to embodiments described herein.

FIG. 5 is a circuit diagram 500 showing the circuit structure of a FIFO element 102 as shown in FIG. 2, according to embodiments described herein. As described in relation to FIG. 2, the FIFO element includes a selectively transparent latch 202 and a flip-flop 206 serially connected downstream to the latch 202. The selectively transparent latch 202 is governed by a latch enable signal 212, which is generated by an AND logic element 220 configured to perform an AND logic operation on the inverted device clock signal 216 and an input ready signal 416 (e.g., similar to the input ready signal 416 described in FIG. 4) so that the latch enable signal 212 is synchronized with the device clock signal 216, in an embodiment. The selectively transparent latch 202 is configured to only pass through the input data units when the latch enable signal 212 is high. Specifically, when the input ready signal 416 is high, the latch 202 is transparent and data units pass through the latch 202. However, when the input ready signal 416 is low, data units are stalled in the latch 201 and not passed through. As seen in the figure, the latch enable signal 212 governing transparency of the latch is a logical combination of the device clock signal 216, which in the depicted embodiment is inverted, and an input ready signal 416 that is derived based on a fill status of the flip-fop 206, and is indicative of whether the flip-flop 206 is ready to receive new data, in an embodiment. For example, when the fill status of the flip-flop 206 indicates the flip-flop 206 is occupied, the input ready signal 416 is generated to be low, which leads to a low voltage level of the latch enable signal 212 such that the latch 202 stalls passage of data units to the flip-flop 206. For another example, when the fill status of the flip-flop 206 indicates the flip-flop 206 is not occupied, the input ready signal 416 is generated to be high, which leads to a high voltage level of the latch enable signal 212 such that the latch 202 is able to pass data units to the flip-flop 206. The logic component 204, specifically the AND logic 220 in an embodiment, is part of or connected to control circuitry that is configured to monitor the status of the flip-flop 206 to generate the input ready signal 416. It is noted that any suitable logic component and clock inversion can be used to selectively govern transparency of latch 202.

The flip-flop 206 is controlled by a gated clock signal 214 generated by a gated clock element 208 synchronized to the device clock signal 216. The gated clock element 208 is configured to receive an input 232 of:

~(Dout_valid & ~Dout_ready)

where Dout_valid represents the output-valid signal 414 shown in FIG. 4, and Dout_ready represents the output ready signal 418 shown in FIG. 4. Control circuitry inside the FIFO element is configured to perform logic operations (e.g., ~(Dout_valid & ~Dout_ready)) on the output-valid signal 414 and the output ready signal 418 to generate the input signal 232 to the gated clock element 208, in an embodiment.

Circuit 228 provides an enlarged view of the internal circuit structure of the gated clock element 208. As shown at 228, the gated clock element (208) includes a gated latch 510 (different from the selectively transparent latch 202) governed by the device clock signal 216. The gated latch 510 is configured to pass through, or stall passage of the input signal 232 (e.g., ~(Dout_valid & ~Dout_ready), or sometimes can be Dout_ready) alone) depending on a voltage level of the inverted device clock signal 216). For example, when the voltage level of the device clock signal 216 is high, the gated latch 510 is configured to generate an output signal 233 copied from the input signal 232. When the voltage level of the device clock signal 216 is low, the gated latch 510 is configured to stall passage of the input signal 232 to the output, and the output signal 233 is configured to change again to match the input signal 232 until the device clock signal 216 goes high again in the next clock cycle.

The gated clock element 208, shown in detail at box 228, further includes an AND logic element 512 configured to perform an AND logic operation on the device clock signal 216 and an output signal 233 from the latch 510 to generate the gated clock signal 214 (referred to as clk_out). The clk_out signal, i.e., the gated clock signal 214 is then in turn fed to the flip-flop 206 as a triggering clock. The flip-flip 206 is configured to receive data units 235 from the latch 202, and only output the received data unit 410 at a triggering edge (e.g., a rising edge or a falling edge) of the gated clock signal 214.

The gated signal 214 is essentially generated based on an input of ~(Dout_valid & ~Dout_ready) from the gated latch 510 gated by the device clock signal 216, in an embodiment. The flip-flop 206, which is triggered by the gated signal 214, is thus affected by any change in the Dout_valid (412 in FIG. 4) and Dout_ready (418 in FIG. 4) signal. For example, when Dout_ready goes from high to low, indicating that the next memory element is not ready to receive new data, the input signal 232 to the gated clock element 208 goes from high to low accordingly, rendering the gated signal 214 to stay low even at the next rising edge of the device clock signal 216—that is to say, the gated signal 214 does not generate a triggering edge, and the flip-flop 206 is consequently configured to "hold" a data unit without outputting the data unit to the next memory element.

When data units are passed along a wired coupling between the dispatcher 101 and the capturer 108 as described in FIG. 1, the FIFO elements 102-106 may each receive a write or read command (e.g., an enable signal) in consecutive clock cycles, e.g., to ("write") temporarily store up to two data units during two consecutive clock cycles, and to ("read") output the stored data units to the next memory element during the next clock cycle, respectively. For example, during a first clock cycle in response to a write command (e.g., an enable signal for the FIFO element shown at diagram 500 to receive new data units for temporary storage), the selectively transparent latch 202 is configured to receive and pass through the first data unit to the flip-flop 206, and the flip-flop 206 is configured to receive and temporarily store the first data unit. During a second clock cycle of a write command, the selectively transparent latch 202 is configured to receive the second data unit, but stall passage of the second data unit to the first flip-flop, while the flip-flop 206 is configured to continue storing the first data unit. When a read command (e.g., an enable signal for the FIFO memory element shown at diagram 500 to output a temporarily stored data unit) is received at the third clock cycle, the flip-flop 206 is configured to output the first data unit to the next memory element at a triggering edge of the third clock cycle, and to sample an output data unit from the selectively transparent latch 202 and temporarily store the output data unit.

Figure 6:
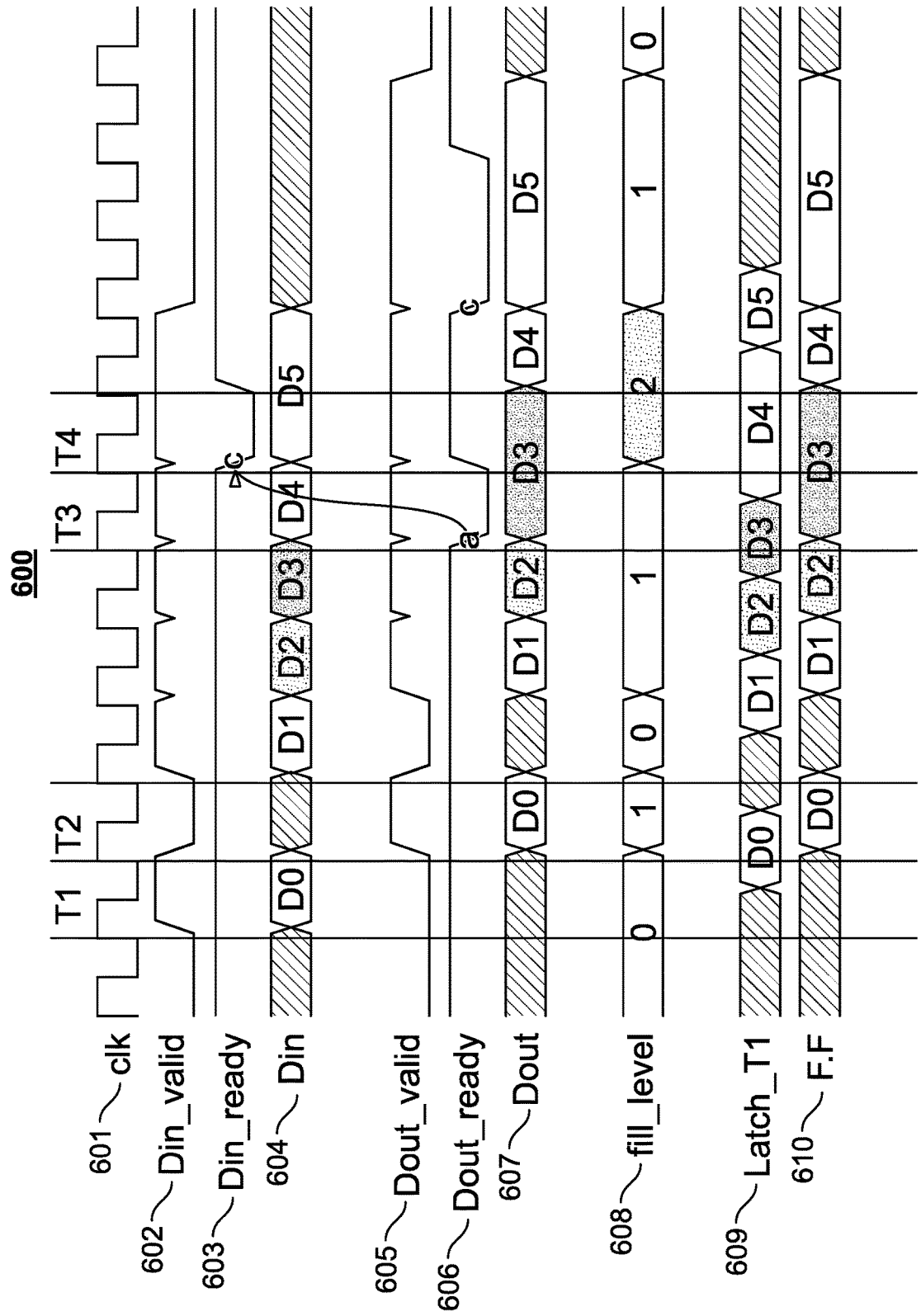
FIG. 6 shows an example timing diagram various input/output signals employed in the FIFO memory element shown in FIG. 5, according to embodiments described herein.

For example, the FIFO element shown at the diagram 500 suitably works in a manner shown by the example timing diagram 600 in FIG. 6. In FIG. 6, the waveform clk 601 represents the signal waveform for the device clock signal 216 in FIGS. 4-5. Waveform Din_valid 602 represents the signal waveform for the input-valid signal 412 in FIG. 4. Waveform Din_ready 603 represents the signal waveform for the input-ready signal 416 in FIGS. 4-5, indicating whether the FIFO element 500 is ready to receive new data. Specifically, when Din_ready 603 is low, the selectively transparent latch 202 stalls passage of data units 408. Waveform Din 604 represents the signal waveform for input data 408 in FIGS. 4-5. Waveform Dout_valid 605 represents the signal waveform for the output-valid signal 414 in FIG. 4, indicating whether an output data unit from the FIFO element 500 is valid. Waveform Dout_ready 606 represents the signal waveform for the output ready signal 418 in FIG. 4, indicating whether the FIFO element 500 is ready to output data. Waveform Dout 607 represents the signal waveform for the output data 410 in FIGS. 4-5. Waveform Latch_T1 609 represents the signal waveform for the output 235 from latch 202 in FIG. 5. Waveform F.F 610 represents the signal waveform for the output from flip-flop 206 in FIG. 5, which is equivalent to the waveform 607. Control circuitry within the FIFO element is configured to monitor the number of data units temporarily stored at the FIFO element, represented by the parameter Fill_level 608.

At clock cycle $T_1$ (shown at the waveform 601 for device clock signal), the FIFO memory element shown at diagram 500 receives a write command to temporarily store a first data unit D0 (shown at the waveform for Din at 604). The input-valid signal Din_valid 602 (e.g., 412 in FIG. 4) goes from low to high during clock cycle $T_1$, indicating the input data is valid. The input-ready signal Din_ready 603 (e.g., 416 in FIG. 4) is high during clock cycle $T_1$, indicating the FIFO element is ready to receive new data. The selectively transparent latch 202 in FIG. 5, is configured to receive and pass through the first data unit D0 from Din 602 to the flip-flop 206 during the latter half of the clock cycle $T_1$. For example, during the latter half of the clock cycle T1, when clk 601 is low and thus the inverted clk 601 is high, the latch enable signal 212 shown in FIG. 5 is high to allow transparency of the latch 202. Thus, the output of the latch 202, Latch_T1 609 shows a value of D0 during the latter half of clock cycle $T_1$. At clock cycle T1, Fill_level=0 (shown at 608), as the flip-flop 206 does not store any data units.

At clock cycle T2, after the latch 202 has passed data unit D0 through to the flip-flop 206, the flip-flop 206 is to receive and temporarily store the data unit D0, and the control circuit is configured to update the parameter Fill_level 608 to be 1 based on the number of data unit that is temporarily stored at flip-flop 206. During the clock cycle T2, the flip-flop 206 is configured to output the data unit D0, as shown at the waveform F.F. 610 and the waveform Dout 607. The output 607 of D0 happens at the rising edge of Dout_valid 605 during clock cycle T2, which also leads to a rising edge of the gated clock signal (e.g., 214 in FIG. 4). During the clock cycle T2, Fill_level=1, as the flip-flop 206 temporarily store data unit D0.

The waveforms 601-610 may evolve in a similar manner as described with regard to clock cycles T1 and T2, until clock cycle T3, when Dout_ready 606 goes low, indicating the next memory element is not ready to receive new data (e.g., when the next memory element currently stores two data units already), the gated clock signal 214 remains low and thus does not create a triggering edge for the flip-flop 206. The flip-flop 206 is configured to receive and temporarily store a new data unit D4, without releasing the new data unit D4 during clock cycle T4. During clock cycle T4, the flip-flop output F.F 610 remains unchanged from clock cycle T3, e.g., the flip-flop still outputs data unit D3 without releasing the newly received data unit D4 during clock cycle T4. At clock cycle T4, when the flip-flop 206 temporarily stores data unit D4, control circuitry is configured to determine that the flip-flop 206 is occupied by a data unit and in turn changes Din_ready to be low at the beginning of clock cycle T4, indicating the FIFO element is not ready to receive new data. Control circuitry is then configured to increment the Fill_level 608 from 1 to 2 based on the fact that Din_ready 603 is low and the flip-flop 206 is occupied by a data unit to reflect that the FIFO element is occupied with two data units.

FIG. 7 provides an example diagram 700 showing an alternative structure for the FIFO element (one of 102-104 in FIG. 4), according to embodiments described herein. Diagram 700 shows a flip-flop 702 configured to receive data units that are transferred along the wired coupling. The flip-flop 702 is governed by a gated clock signal 703, which is generated by a gated clock element 704 similar to the gated clock element 208 in FIG. 5 to synchronize with the device clock signal 216, and is configured to temporarily store the data unit received from a previous memory element and to release the stored data unit according to a triggering edge of the gated clock signal 703. A selectively transparent latch 710 is separate from, and is serially coupled downstream of the flip-flop 702, in an embodiment, and the transparency of the selectively transparent latch 710 is governed by a latch control signal 713, which is in the form of a gated clock signal that is synchronized to the device clock signal 216. The selectively transparent latch 710 is configured to transparently pass the data unit released from the flip-flop 702, or to stall passage of the data units, based on a voltage level of the gated clock signal 713 generated by a gated clock element 712 having a similar structure to the gated clock element 208 in FIG. 5 to synchronize with the device clock signal 216.

The FIFO element shown by diagram 700 includes two gated clock elements 704 and 712, to generate the gated clock signals 703 and 713, respectively. A first gated clock circuit is configured to generate the gated clock signal 703 for the flip-flop 702. The first gated clock circuit 704 has a similar structure as the gated clock element 208 in FIG. 5, which includes a gated latch (similar to 510 in FIG. 5) governed by the device clock signal 216, and the latch is configured to pass through, or stall passage of an input ready signal (e.g., 416 in FIG. 4) depending on a voltage level of the device clock signal 216. For example, when the device clock signal 216 is high, the gated latch is configured to pass through the input signal 706; when the device clock signal 216 is low, the gated latch is configured to stall passage of the input signal 706. In some embodiments, the input signal to the gated clock circuit 704 is the product of the input ready signal (e.g., 416 in FIG. 4) and the input valid signal (e.g., 412 in FIG. 4), represented by Din_ready & Din_valid. The gated clock circuit 704 further includes an AND logic element (similar to 512 in FIG. 5) configured to perform an AND logic operation on the device clock signal 216 and an output signal from the latch to generate the gated clock signal 703, in an embodiment.

Similarly, the second gated clock element 712 includes a latch (e.g., similar to 510 in FIG. 5) governed by the device clock signal 216, and the latch is configured to pass through, or stall passage of an output ready signal (e.g., 418 in FIG. 4) depending on a voltage level of the device clock signal 216. For example, when the device clock signal 216 is high, the gated latch is configured to pass through the input signal 714; when the device clock signal 216 is low, the gated latch is configured to stall passage of the input signal 714. In some embodiments, the input signal 714 to the gated clock element 712 is based on the output ready signal (e.g., 418 in FIG. 4), output valid signal (e.g., 414 in FIG. 4), input-valid signal (e.g., 412 in FIG. 4), and the Fill_level parameter, indicating the number of data units temporarily stored at the FIFO element (e.g., see 508 in FIG. 5), represented by ~(Dout_valid & ~Dout_ready) & (Din_valid|fill_level==2). The FIFO element described by diagram 700 further includes logic circuitry to perform the operation ~(Dout_valid & ~Dout_ready) & (Din_valid|fill_level==2) to generate the input signal 714 for the gated clock element 712.

Control circuitry inside the FIFO element is configured to determine a fill status of the flip-flop 702, which is in turn used to derive the fill_level parameter. For example, when the flip-flop 702 is occupied by a first data unit, and a second data unit is stalled by the latch, fill_level=2. When fill_level=2, indicating the FIFO element described at 700 has temporarily stored two data units and has reached its maximum capacity, the input signal 714 goes high (assuming Dout_valid and Dout_ready are high) such that the latch enable signal 713 goes high for the selectively transparent latch 710 to pass data units so as to vacate storage from the flip-flop 702. The voltage level of the latch enable signal 713, high or low, is thus derived from, and indicative of at least the fill status of the flip-flop 702, because the fill status of the flip-flop 702 is related to the fill_level parameter.

The gated clock element 712 further includes an AND logic element (similar to 512 in FIG. 5), in an embodiment, to perform an AND logic operation on the device clock signal 216 and an output signal from the latch (similar to 510 in FIG. 5) to generate the gated clock signal 713.

The FIFO element described at diagram 700 is configured to receive a first write command (e.g., an enable signal for the FIFO element shown at diagram 700 to receive new data units for temporary storage) to temporarily store a first data unit at a first clock cycle and a second write command to temporarily store a second data unit at a second clock cycle. During the first clock cycle, the flip-flop 702 is configured to receive the first data unit and temporarily store the first data unit. During the second clock cycle, the flip-flop 702 is configured to release the first data unit at a triggering edge of the gated clock signal 703, and the selectively transparent latch 710 is configured to receive and pass the first data unit through as the output of the FIFO element, when the gated clock signal 713 is high as Dout_valid, Dout_ready are both high. The output of the latch 710 is synchronized with the device clock signal 216, as the gated clock signal 713 controlling the latch 710 is synchronized to the device clock signal 216. The flip-flop 702 is also configured to receive and temporarily store the second data unit.

Figure 8:
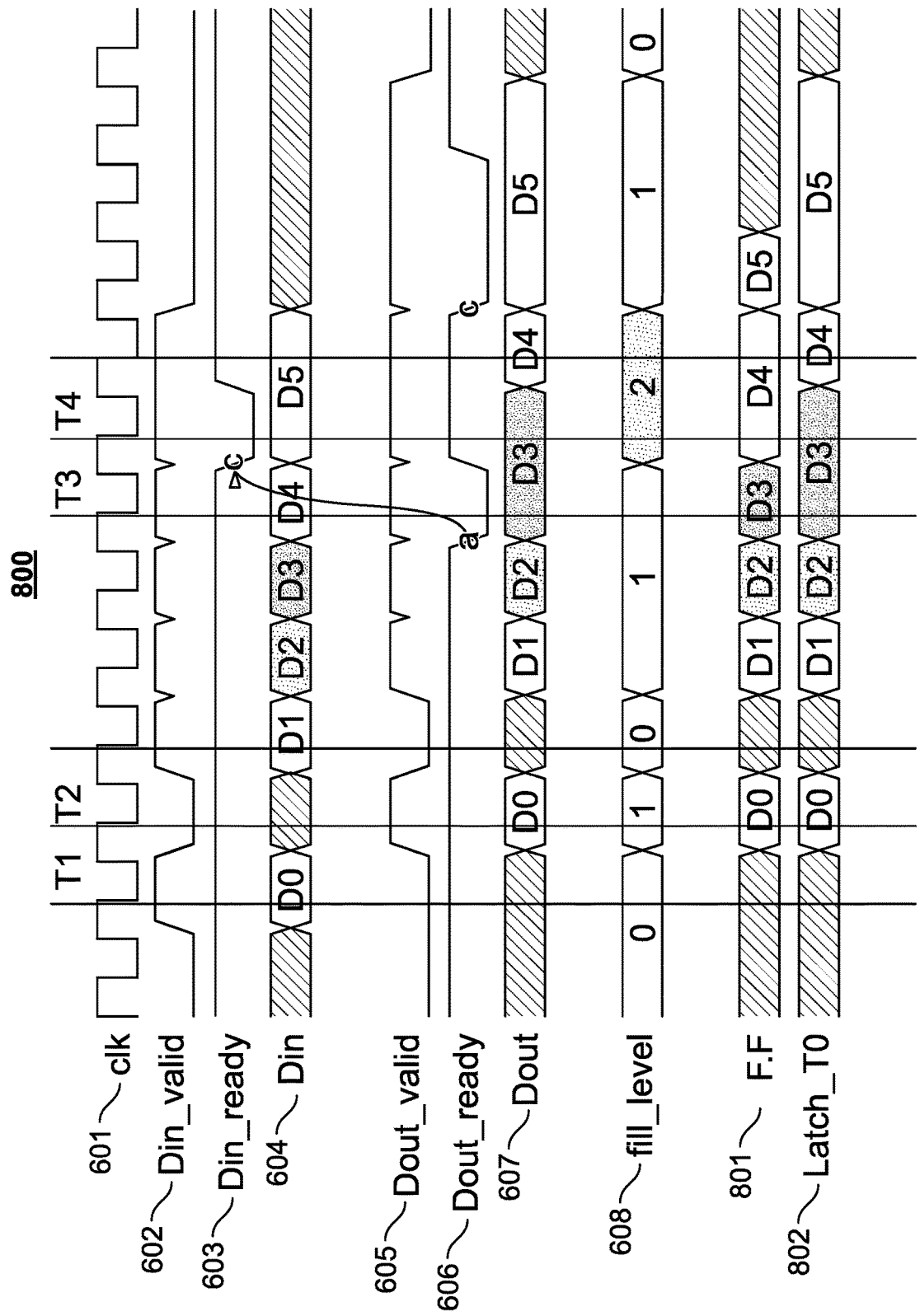
FIG. 8 shows an example timing diagram various input/output signals employed in the FIFO memory element shown in FIG. 7, according to embodiments described herein.

For example, the FIFO element seen at the diagram 700 may work in the manner depicted in the example timing diagram 800 in FIG. 8. In FIG. 8, the waveforms 601-608 are defined in a similar way as waveforms 601-608 shown in FIG. 6. Waveform F.F 801 represents the signal waveform for the output from the flip-flop 702 in FIG. 7. Waveform latch_T0 802 represents the signal waveform for the output from latch 710 in FIG. 7, which is equivalent to the waveform 607 representing the output of the FIFO element.

As described in relation to FIG. 1, when data units are passed along a wired coupling between the dispatcher 101 and the capturer 108 as described in FIG. 1, the FIFO elements 102-106 may each receive a write or read command in consecutive clock cycles, e.g., an enable signal for a FIFO element to temporarily store up to two data units during two consecutive clock cycles, or an enable signal for a FIFO element to output the stored data units to the next memory element during the next clock cycle, respectively. At clock cycle $T_1$, when the FIFO memory element shown at diagram 700 is configured to receive a write command to temporarily store a first data unit D0 (shown at the waveform for Din at 604). The input-valid signal is high, indicating the input data is valid, as shown at the waveform for Din_valid 602. The input-ready signal Din_ready 603 is high, indicating the FIFO element is ready to receive new data because the flip-flop 702 is not occupied by any data unit. The flip-flop 702 in FIG. 7, is configured to receive and temporarily store data unit D0. At clock cycle T2, Din_ready 603 is high, but Din_valid 605 is low, rendering Din_ready & Din_valid is low and thus the gated clock signal 703 has a rising edge at the rising edge of the clock 601. The flip-flop 702 is configured to release data unit D0, as reflected at F.F. 801. The latch 710 is configured to pass through data unit D0 from the flip-flop 702, as reflected at Latch_T0 802.

At clock cycle T3, when Dout_ready 606 goes low, indicating the next memory element is not ready to receive new data, the gated clock signal 713 in turn changes from high to low. The latch 710 stalls passage of the new data unit D4 during clock cycle T4, but maintains the same output unit D3 for clock cycle T4, as reflected at latch_T0 802 and Dout 607 at clock cycle T4. At clock cycle T4, as the new data unit D4 is stalled from output, the Fill_level 608 is updated to be two, indicating that the FIFO element has temporarily stored two data units, and cannot receive new data, as reflected by Din_ready 603 goes from high to low.

Figure 9:
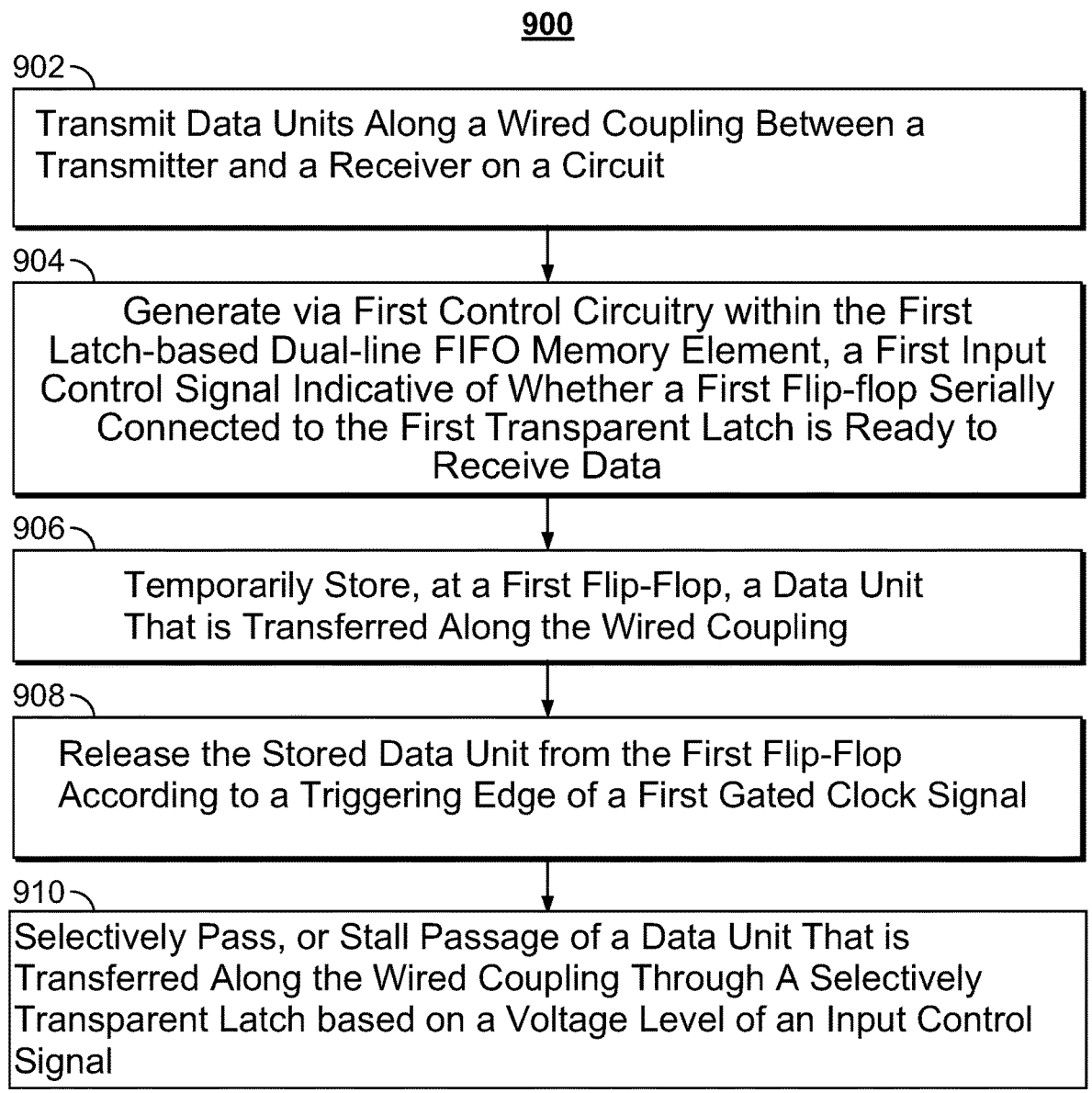
FIG. 9 provides a logic flow diagram illustrating an example process of synchronizing data between a signal originator and a signal receiver over a wired coupling as shown in FIG. 1, according to embodiments described herein.

FIG. 9 provides a logic flow diagram 900 illustrating an example process of synchronizing data between a signal originator and a signal receiver over a wired coupling as shown in FIG. 1, according to embodiments described herein. At 902, data units (e.g., see 112 in FIG. 1, 408 in FIG. 4) are transferred through one or more data synchronizers (e.g., see 102-106 in FIG. 1) disposed along the wired coupling between a transmitter (e.g., 101 in FIG. 1) and a receiver (e.g., 108 in FIG. 1) in synchronization to a device clock signal (e.g., see 216 in FIG. 4). At 904, a latch enable signal (e.g., see 416 in FIG. 4) is generated, the latch enable signal being indicative of whether a first flip-flop (e.g., see 206 in FIG. 5 or 702 in FIG. 7) serially connected to the first transparent latch (e.g., 202 in FIG. 5 or 710 in FIG. 7) is ready to receive data. At 906, the data unit that is transferred along the wired coupling is received and temporarily stored at the first flip flop (e.g., see 206 in FIG. 5 or 702 in FIG. 7). At 908, the stored data unit is released from the first flip-flop according to a triggering edge of a first gated clock signal. For example, as shown in FIG. 2, a data unit is released from the flip-flop 206 to the next FIFO element. For another example, as shown in FIG. 7, a data unit is released from the flip-flop 702 to the selectively transparent latch 710. At 910, the data unit that is transferred along the wired coupling is selectively passed, through a first selectively transparent latch (e.g., see 202 in FIG. 5 or 710 in FIG. 7) to the next memory element (e.g., see flip-flop 206 in FIG. 5 or a next FIFO element connected to the latch 710 in FIG. 7), or passage of the data unit is stalled, based on a voltage level of a latch enable signal (e.g., see 212 in FIG. 5 or 713 in FIG. 7). For example, the next memory element may be a flip-flop (e.g., 206 in FIG. 5), or a next FIFO element.

Specifically, in an embodiment in accordance with the FIFO element shown at 500 in FIG. 5, step 910 take places before steps 906 and 908. For example, in the embodiment described in relation to FIG. 5, a data unit is first passed through a selectively transparent latch at 910, to a flip-flop that is connected downstream to the latch, and then the data unit is temporarily stored and released from the flip-flop at 906-908. Alternatively, in an embodiment in accordance with the FIFO element shown at 700 in FIG. 7, steps 906, 908 and 910 occur in an order as described in FIG. 9.

What is claimed is:

1. An electronic device in which synchronized data signals are transmitted between a signal originator and a signal receiver, the electronic device comprising:
    a data transmitter disposed on the electronic device and configured to transmit data units to a receiver on the electronic device over a wired coupling;
    one or more data synchronizers disposed along the wired coupling and being operative to synchronize, to a device clock signal, transfer of the data units over the wired coupling;
    the one or more data synchronizers comprising a first data synchronizer being configured as a first first-in-first-out (FIFO) memory element for temporarily storing up to two data units according to an order received, the first FIFO memory element including:
        a first flip-flop governed by a first gated clock signal, the first flip-flop being configured to temporarily store a data unit that is transferred along the wired coupling and to release the stored data unit according to a triggering edge of the first gated clock signal; and
        a first selectively transparent latch serially coupled to the first flip-flop and governed by a latch enable signal that is indicative of a fill status of the first flip-flop, the first selectively transparent latch being configured to transparently pass data units to a next memory storage element when a voltage level of the latch enable signal is high, or to stall passage of the data units when the voltage level of the latch enable signal is low.

2. The electronic device of claim 1, wherein the first selectively transparent latch is serially connected to an input of the first flip-flop, and the first flip-flop is configured to receive data units passed through from the first selectively transparent latch, and
    the first FIFO memory element further comprises:
    control circuitry configured to:
    determine the fill status of the first flip-flop, and
    generate an input ready signal having a high voltage level when the determined fill status of the first flip-flop indicates the first flip-flop is ready to receive new data, or a low voltage level when the determined fill status of the first flip-flop indicates the first flip-flop is not ready to receive new data.

3. The electronic device of claim 2, wherein the first FIFO memory element further comprises:
    an AND logic element configured to perform an AND logic operation on the device clock signal and the input ready signal indicating availability of the first flip-flop to receive new data to generate the latch enable signal that is synchronized to the device clock signal for the first selectively transparent latch.

4. The electronic device of claim 1, wherein the first FIFO memory element further includes:
    a gated clock circuit, configured to generate the gated clock signal, including:
        a second latch governed by the device clock signal, the second latch being configured to pass through, or stall passage of a first output ready signal depending on a voltage level of the device clock signal,
        wherein the output ready signal is received from a second FIFO memory element serially connected to the first FIFO memory element; and
        an AND logic element configured to perform an AND logic operation on the device clock signal and an output signal from the second latch to generate the gated clock signal that triggers the first flip-flop to release a stored data unit.

5. The electronic device of claim 1, wherein the first FIFO memory element is configured to receive a first write command to temporarily store a first data unit at a first clock cycle and a second write command to temporarily store a second data unit at a second clock cycle, and
    wherein:
        during the first clock cycle, the first selectively transparent latch is configured to receive and pass through the first data unit to the first flip-flop, and the first flip-flop is configured to receive and temporarily store the first data unit; and
        during the second clock cycle subsequent to the first clock cycle, the first selectively transparent latch is configured to receive the second data unit and stall passage of the second data unit to the first flip-flop, and the first flip-flop is configured to continue storing the first data unit.

6. The electronic device of claim 5, wherein the first FIFO memory element is configured to receive a read command at a third clock cycle, and
    wherein:
        during the third clock cycle, the first flip-flop is configured to output the first data unit to the next memory element at a triggering edge of the third clock cycle, and to sample an output data unit from the first selectively transparent latch and temporarily store the sampled output data unit.

7. The electronic device of claim 1, wherein the first selectively transparent latch is serially connected to an output of the first flip-flop, and the first selectively transparent latch is configured to receive data units released from the first flip-flop, and the first FIFO memory element further comprises:
    control circuitry configured to:
    determine the fill status of the first flip-flop;
    determine a number of data units that are temporarily stored at the first FIFO memory element based at least in part on the fill status of the first flip-flop; and
    generate a high voltage level for the latch enable signal for the selectively transparent latch to pass data units when the number of data units equals two.

8. The electronic device of claim 7, wherein the first FIFO element further comprises:
    a first gated clock circuit configured to generate the first gated clock signal, the first gated clock element including:
        a second latch governed by the device clock signal, the second latch being configured to pass through a first input ready signal when a voltage of the device clock signal is high, or stall passage of the first input ready signal when the voltage level of the device clock signal is low, and
        an AND logic element configured to perform an AND logic operation on the device clock signal and a first output signal from the second latch to generate the first gated clock signal to trigger the first flip-flop to release the stored data unit; and
    a second gated clock element configured to generate the latch enable signal, the second gated clock element including:
        a third latch governed by the device clock signal, the third latch being configured to pass through a first output ready signal when a voltage level of the device signal is high, or stall passage of the first output ready signal when the voltage level of the device clock signal is low; and an AND logic element configured to perform an AND logic operation on the device clock signal and an output signal from the third latch to generate the third gated clock signal.

9. The electronic device of claim 7, wherein the first FIFO memory element is configured to receive a first write command to temporarily store a first data unit at a first clock cycle and a second write command to temporarily store a second data unit at a second clock cycle, and wherein:

during the first clock cycle, the second flip-flop is configured to receive and temporarily store the first data unit before a next triggering edge of the first gated clock signal;

during the second clock cycle, the second flip-flop is configured to release the first data unit at the next triggering edge of the first gated clock signal, receive and temporarily store the second data unit, and the second selectively transparent latch is configured to receive and pass the first data unit as an output of the first FIFO memory element.

10. The electronic device of claim 1, wherein the one or more data synchronizers comprise a plurality of serially connected FIFO memory elements along the wired coupling including the first FIFO memory element, wherein the first FIFO memory element is configured to:

transmit, a first input ready signal indicating whether the first flip-flop is ready to receive new data, to a previous memory element that is configured to output data to the first FIFO memory element depending on a voltage level of the first input ready signal; and receive a first output ready signal from a next memory element that is configured to receive data from the first FIFO memory element depending on a voltage level of the first output ready signal.

11. A method for synchronizing data between a signal originator and a signal receiver over a wired coupling, the method comprising:

transferring data units through one or more data synchronizers disposed along the wired coupling in synchronization to a device clock signal;

receiving the data units that are transferred along the wired coupling, at a first data synchronizer configured as a first FIFO memory element;

temporarily storing, at a first flip-flop disposed within the first FIFO element, a data unit that is transferred along the wired coupling;

releasing the stored data unit according to a triggering edge of a first gated clock signal; and selectively passing, through a first selectively transparent latch serially connected to the first flip-flop, the first selectively transparent latch being governed by a latch enable signal indicative of a fill status of the first slip-flop, the data units that are transferred along the wired coupling, to a next memory element when a voltage level of the latch enable signal is high, or to stall passage of the data units when the voltage level of the latch enable signal is low.

12. The method of claim 11, further comprising:

receiving, at the first flip-flop that is serially connected downstream to the selectively transparent latch, data units passed through from the first selectively transparent latch;

determining a fill status of the first flip-flop, and generating an input ready signal having a high voltage level when the determined fill status of the first flip-flop indicates the first flip-flop is ready to receive new data, or a low voltage level when the determined fill status of the first flip-flop indicates the first flip-flop is not ready to receive new data.

13. The method of claim 12, further comprising:

performing, at an AND logic element within the first FIFO memory element, an AND logic operation on the device clock signal and the input ready signal indicating availability of the first flip-flop to receive new data to generate the latch enable signal for the first selectively transparent latch.

14. The method of claim 11, further comprising:

generating, at a gated clock circuit within the first FIFO memory element, the gated clock signal by:

passing through or stall passage of, at a second latch governed by the device clock signal, a first output ready signal depending on a voltage level of the device clock signal, wherein the output ready signal is received from the next memory element; and performing, at an AND logic element, an AND logic operation on the device clock signal and an output signal from the second latch to generate the gated clock signal that triggers the first flip-flop to release a stored data unit.

15. The method of claim 11, further comprising:

receiving, at the first FIFO memory element, a first write command to temporarily store a first data unit at a first clock cycle and a second write command to temporarily store a second data unit at a second clock cycle;

during the first clock cycle, receiving and passing through, at the first selectively transparent latch, the first data unit to the first flip-flop, and receiving and temporarily store, at the first flip-flop, the first data unit; and during the second clock cycle subsequent to the first clock cycle, receiving and stalling passage of, at the first selectively transparent latch, the second data unit to the first flip-flop, and continuing storing the first data unit at the first flip-flop.

16. The method of claim 15, further comprising:

receiving, at the first FIFO memory element, a read command at a third clock cycle;

during the third clock cycle, outputting, from the first flip-flop, the first data unit to the next memory element at a triggering edge of the third clock cycle, and sampling an output data unit from the first selectively transparent latch and temporarily storing the output data unit.

17. The method of claim 11, further comprising:

receiving, at the first selectively transparent latch that is serially connected downstream to an output of the first flip-flop, data units released from the first flip-flop;

determining the fill status of the first flip-flop;

determining a number of data units that are temporarily stored at the first FIFO memory element based at least in part on the fill status of the first flip-flop; and generating a high voltage level for the latch enable signal for the selectively transparent latch to pass data units when the number of data units equals two.

18. The method of claim 17, further comprising:
generating, at a first gated clock circuit, the first gated clock signal by:
  passing through, at a second latch governed by the device clock signal, a first input ready signal when a voltage level of the device clock signal is high, or stalling passage of the first input ready signal when the voltage level of the device clock signal is low,
  performing, at an AND logic element, an AND logic operation on the device clock signal and a first output signal from the second latch to generate the first gated clock signal; and
generating, at a second gated clock element, the first input clock signal by:
  passing through, at a third latch governed by the device clock signal, a first input ready signal when a voltage level of the device clock signal is high, or stalling passage of the first input ready signal when the voltage level of the device clock signal is low, and
  performing, at an AND logic element, an AND logic operation on the device clock signal and an output signal from the third latch to generate the first input clock signal.

19. The method of claim 17, further comprising:
receiving, at the first FIFO memory element, a first write command to temporarily store a first data unit at a first clock cycle and a second write command to temporarily store a second data unit at a second clock cycle;
during the first clock cycle, receiving and temporarily store at the second flip-flop, the first data unit before a next triggering edge of the first gated clock signal;
during the second clock cycle,
  releasing, at the second flip-flop, the first data unit at the next triggering edge of the first gated clock signal,
  receiving and temporarily storing the second data unit, and
  receiving and passing through, at the second selectively transparent latch, the first data unit as an output of the first FIFO memory element.

20. The method of claim 11, further comprising:
transmitting, from the first FIFO memory element, a first input ready signal indicating whether the first flip-flop is ready to receive new data, to a previous memory element that is configured to output data to the first FIFO memory element depending on a voltage level of the first input ready signal; and
receiving a first output ready signal from a next memory element that is configured to receive data from the first FIFO memory element depending on a voltage level of the first output ready signal.

* * * * *